(12) United States Patent
Cao et al.

(10) Patent No.: US 9,797,062 B2
(45) Date of Patent: Oct. 24, 2017

(54) ZONE MELTING FURNACE THERMAL FIELD WITH DUAL POWER HEATING FUNCTION AND HEAT PRESERVATION METHOD

(71) Applicant: ZHEJIANG JINGSHENG M & E CO., LTD, Shangyu (CN)

(72) Inventors: Jianwei Cao, Shangyu (CN); Penggen Ouyang, Shangyu (CN); Dantao Wang, Shangyu (CN); Linjian Fu, Shangyu (CN); Mingjie Chen, Shangyu (CN); Gang Shi, Shangyu (CN); Minxiu Qiu, Shangyu (CN)

(73) Assignee: ZHEJIANG JINGSHENG M & E CO., LTD, Shangyu, Zhejiang (CN)

( * ) Notice: Subject to any disclaimer, the term of this patent is extended or adjusted under 35 U.S.C. 154(b) by 20 days.

(21) Appl. No.: 14/787,227

(22) PCT Filed: May 16, 2013

(86) PCT No.: PCT/CN2013/075696
§ 371 (c)(1),
(2) Date: Oct. 26, 2015

(87) PCT Pub. No.: WO2014/172928
PCT Pub. Date: Oct. 30, 2014

(65) Prior Publication Data
US 2016/0115619 A1    Apr. 28, 2016

(30) Foreign Application Priority Data

Apr. 25, 2013 (CN) .......................... 2013 1 0148579

(51) Int. Cl.
*C30B 13/18* (2006.01)
*C30B 13/20* (2006.01)
(Continued)

(52) U.S. Cl.
CPC .............. *C30B 13/18* (2013.01); *C30B 13/20* (2013.01); *C30B 13/28* (2013.01); *C30B 29/06* (2013.01)

(58) Field of Classification Search
CPC combination set(s) only.
See application file for complete search history.

(56) References Cited

U.S. PATENT DOCUMENTS 3,649,210 A * 3/1972 Keller ..................... C30B 13/16
                                                            117/204
4,410,796 A * 10/1983 Wilsey .................... F27D 11/02
                                                            117/210
(Continued)

FOREIGN PATENT DOCUMENTS

CN        1847468        10/2006
CN      102140673         8/2011
(Continued)

OTHER PUBLICATIONS

International Search Report of PCT/CN2013/075696, dated Jan. 20, 2014, and English translation, 6 pages total.

*Primary Examiner* — Duy Deo
*Assistant Examiner* — Erin Bergner
(74) *Attorney, Agent, or Firm* — Hamre, Schumann, Mueller & Larson, P.C.

(57) ABSTRACT

The present invention aims at providing a zone melting furnace thermal field with a dual power heating function and a heat preservation method. The zone melting furnace thermal field comprises a primary heating coil and an auxiliary heater, wherein the auxiliary heater has a wavy appearance bent repeatedly up and down and forms a circular loop by surrounding in the horizontal direction, wherein both end parts of the auxiliary heater are provided with ports and are connected with an auxiliary heating power supply through cables; and the auxiliary heating power supply is also
(Continued)

sequentially connected with a data analysis module and an infrared temperature measuring instrument through single lines. The present invention can solve the problem of single crystal rod cracking caused by unreasonable distribution of the thermal field and overlarge thermal stress in the growth process of zone-melted silicon single crystals over 6.5 inches, and simultaneously can improve the thermal field distribution in the growth process of 3-6 inch zone-melted silicon single crystals.

1 Claim, 2 Drawing Sheets

(51) Int. Cl.
*C30B 13/28* (2006.01)
*C30B 29/06* (2006.01)

(56) References Cited

U.S. PATENT DOCUMENTS

| 4,942,279 A * | 7/1990 | Ikeda | C30B 13/20 |
|---|---|---|---|
| | | | 117/222 |
| 2009/0047203 A1 * | 2/2009 | Mueller | C30B 29/06 |
| | | | 423/348 |

FOREIGN PATENT DOCUMENTS

| CN | 102289235 | 12/2011 |
|---|---|---|
| CN | 102321913 | 1/2012 |
| CN | 102358951 | 2/2012 |
| CN | 102534754 | 7/2012 |
| CN | 202492612 | 10/2012 |
| CN | 102808216 | 12/2012 |
| CN | 103255472 | 8/2013 |
| CN | 203284498 | 11/2013 |
| JP | 60-180989 | 9/1985 |

* cited by examiner

ZONE MELTING FURNACE THERMAL FIELD WITH DUAL POWER HEATING FUNCTION AND HEAT PRESERVATION METHOD

TECHNICAL FIELD

The present invention relates to the field of semiconductor manufacturing, in particular to a zone melting furnace thermal field with a dual power heating function.

BACKGROUND ART

Silicon is a basic material in the primary industry, namely the electronic information technology industry throughout the world and accounts for over 95% of the use amount of semiconductor materials in the world. Zone-melted silicon single crystals have the advantages of high purity, good uniformity, few defects and the like owning to its unique growth mode and are thus applicable to high-power semiconductor components. With vigorous development of the electric and electronic industry, various novel electric and electronic devices, such as SR silicon rectifiers, SCR silicon-controlled rectifiers, GTR giant transistors, GTO thyristors, SITH static inductive thyristors, IGBT insulated gate bipolar transistors, PIN ultrahigh voltage diodes, smart power devices and power IC (Integrated Circuit) have more active demands on large-diameter zone-melted silicon single crystals, and therefore, the large-diameter zone-melted silicon single crystals have a broad application field and a favorable development prospect. A float zone melting method is adopted for the growth of the zone-melted silicon single crystals, that is to say, polycrystalline silicon materials are heated by adopting a high-frequency primary heating coil and are then molten, and the molten silicon is caught by seed crystals below the coil to continuously grow single crystal rods. By the adoption of float zone melting, the thermal field is concentrated near the melting zone, and the temperature distribution below the melting zone is not uniform. Especially for the growth of the large-diameter silicon single crystals, the surfaces of the single crystal rods are rapidly cooled, the radial temperature gradient of the center and the surface is enlarged, and thus the silicon single crystals are cracked. With the increase of the diameter of the single crystal rod, the melting zone area and the thermal stress are increased in a geometric level, and when the thermal stress of the single crystal rod is larger than its critical shear pressure, the single crystal rod shifts to cause broken ridges, and even rupture to further affect the production efficiency and damage equipment. In the existing technology, all large-diameter zone-melted single crystal silicon over 6.5 inches faces to the problem of single crystal rod cracking owing to unreasonable distribution of the thermal field and overlarge thermal stress, and broken ridges caused by unreasonable distribution of the thermal field and overlarge thermal stress in the growth process of 3-6 inch zone-melted single crystal silicon are one of the most major problems for improving the productivity of the silicon single crystals.

The zone melting furnace thermal field in the existing technology employs a single heat source, namely material feeding and melting are carried out by adopting a high-frequency power supply through a primary heating coil. It is difficult to adjust the heating process of a single power supply, and is especially difficult to control the thermal field distribution of a single crystal rod below the primary heating coil. In order to remedy the problem of insufficient heat of the single crystal rod below the melting zone and improve the distribution of the thermal field below the melting zone, a copper heat preservation ring device (refer to FIG. 1) is often adopted in the existing technology. The copper heat preservation ring device can reflect heat irradiated from the melting zone to the surface of the silicon single crystal to play a certain heat preservation role in the single crystal rod below the melting zone. However, the copper heat preservation ring device can only reflect the heat irradiated from the melting zone passively, and thus the reflected heat is uncontrollable in size and position. PRC (Disclosure) patents CN 102808216 A, CN102321913 A, CN102358951 A, CN202492612U and the like disclose a thermal field structure employing such primary heating ring and such heat preservation ring respectively, and different materials are also adopted for heat preservation in the disclosed technologies, however, these heat preservation devices employ passive heat preservation, are difficult to control and thus are inapplicable to growth of large-diameter zone-melted monocrystalline silicon. Hence, it is urgent to develop a zone melting furnace thermal field with a dual power heating function, so that the zone melting furnace thermal field distribution can be accurately controlled according to technological demands by virtue of reasonable control so as to solve the problem of large-diameter single crystal rod cracking and improve the quality of silicon single crystals.

SUMMARY

The present invention aims at solving the technical problem of providing a zone melting furnace thermal field with a dual power heating function and a heat preservation method, against the defects of the existing technology. In the present invention, the primary heating power and the auxiliary heating power can be adjusted in real time according to technologies so as to be adaptive to growth of single crystal rods different in diameter and crystal orientation.

In order to solve said technical problem, the following solutions are adopted in the present invention:

A zone melting furnace thermal field with a dual power heating function is provided, comprising a primary heating coil which is provided with a circular hole in the center and connected with a primary heating power supply, and is characterized in that it also comprises an auxiliary heater has a wavy appearance bent repeatedly up and down and forms a circular loop by surrounding in the horizontal direction, wherein both end parts of the auxiliary heater are provided with ports and are connected with an auxiliary heating power supply through cables; and the auxiliary heating power supply is also sequentially connected with a data analysis module and an infrared temperature measuring instrument through signal lines.

As an improvement, the diameter of the circular loop surrounded by the auxiliary heater is 150 mm-400 mm, and the height of the wavy shape bent repeatedly up and down is 50 mm-800 mm.

As an improvement, the primary heating power supply and the auxiliary heating power supply are independent of each other, and each of which is provided with a control operation module and a shielding anti-interference device.

As the further purpose of the present invention, a zone melting furnace heat preservation method for the zone melting furnace thermal field with the dual power heating function in the present invention resides in that: a direct current power supply is applied to the auxiliary heater by means of the auxiliary heating power supply, the auxiliary heater applies thermal irradiation to the single crystal rod growing therein, and thus the heat preservation to the single crystal rod is realized; an infrared temperature measuring instrument is configured to monitor the temperature of a specific point of the single crystal rod in real time and transmit the temperature to the data analysis module, and the data analysis module is configured to control the current of the auxiliary heater by virtue of built-in control methods, so as to adjust a heat preservation effect on the single crystal rod; with regard to the control methods built in the data analysis module, a control target refers to the temperature of the specific point of the single crystal rod, the control input refers to the current of the auxiliary heater, and in addition, different control strategies are adopted in different growth stages, specifically comprising:

in a shoulder expanding stage, the diameter of the single crystal rod changes continuously, and a change curve T(d) of the temperature of the specific point of the single crystal rod along with the diameter of the single crystal rod is set as a target value, wherein the change curve T(d) of the temperature of the specific point of the single crystal rod along with the diameter of the single crystal rod is obtained in a manner of calibrating a production process of the single crystal rod as a standard reference; when the diameter of the single crystal rod is D, the target value T(D) of the temperature of the single crystal rod is obtained through looking up the curve, and temperature deviation $\Delta T=T1-T(D)$, wherein T1 is the temperature, detected by the infrared temperature measuring instrument, of the specific point of the single crystal rod when the diameter of the single crystal rod is D;

a current set value I of the auxiliary heater is controlled in three stages: when the temperature deviation $\Delta T<Tm$, I=Imax, namely the auxiliary heater outputs the maximum current; when $\Delta T>Tb$, I=0, namely the auxiliary heater is switched off; when $Tm \leq \Delta T \leq Tb$, $I=I0-0.45 \times \Delta T+0.0038 \times (D/\Delta T)$, wherein Tm is a lower deviation allowed when the target value of the temperature of the single crystal rod is T(D), Tb is an upper deviation allowed when the target value of the temperature of the single crystal rod is T(D), both of which meet $-20°\ C. \leq Tm \leq 0°\ C. \leq Tb \leq 20°\ C.$, and I0 is an initial set value of the current of the auxiliary heater in the shoulder expanding stage and ranges from 0.3 Imax to 0.5 Imax;

in an equal diameter stage, the current set value I of the auxiliary heater is $I1+0.05 \times T$, wherein I1 is an initial set value of the current of the auxiliary heater in the equal diameter stage and ranges from 0.4 Imax to 0.7 Imax, and T is time entering the equal diameter stage;

in an ending stage, a change curve T(d)' of the temperature of the specific point of the single crystal rod along with the diameter of the single crystal rod is set as a target value, wherein the change curve T(d)' of the temperature of the specific point of the single crystal rod along with the diameter of the single crystal rod is obtained in a manner of calibrating the production process of the single crystal rod as a standard reference; and when the diameter of the single crystal rod is D, the target value T(D)' of the temperature of the single crystal rod is obtained by looking up the curve, and temperature deviation $\Delta T=T1'-T(D)'$, wherein the T1' is the temperature, detected by the infrared temperature measuring instrument, of the specific point of the single crystal rod when the diameter of the single crystal rod is D; and a current set value I of the auxiliary heater is controlled in three stages: when the temperature deviation $\Delta T'<Tm'$, I=Imax, namely the auxiliary heater outputs the maximum current; when $\Delta T'>Tb'$, I=0, namely the auxiliary heater is switched off; when $Tm' \leq \Delta T' \leq Tb'$, $I=I0'-0.65 \times \Delta T'+0.0025 \times (D/\Delta T')$, wherein Tm' is a lower deviation allowed when the target value of the temperature of the single crystal rod is T(D)', Tb' is an upper deviation allowed when the target value of the temperature of the single crystal rod is T(D)', both of which meet $-20°\ C. \leq Tm' \leq 0°\ C. \leq Tb' \leq 20°\ C.$, and I0' is an initial set value of the current of the auxiliary heater in the ending stage and ranges from 0.3 Imax to 0.5 Imax.

In the present invention, the primary heating coil is a cylindrical flat plate, and is provided with a through hole and steps in the center; the power of the primary heating power supply can be set in real time on the site by crystal-pulling workers and also can be adjusted according to a set technology program. A high-frequency alternating-current current is applied by the primary heating power supply, so that a polycrystalline rod inductively generates heat and is molten; the single crystal rod is positioned below the primary heating coil, and molten silicon flows through the center hole of the primary heating coil to connect the polycrystalline rod with the single crystal rod; and the auxiliary heater is disposed outside the single crystal rod, and is heated by means of the auxiliary heating power supply.

Compared with the existing technology, the present invention has the beneficial effects as below:

the thermal field with the dual power heating function is adopted in the production of zone-melted silicon single crystals, wherein the primary heating power supply generates heat by means of the eddy current of the primary heating coil to realize heating and melting of the polycrystalline rod, and the auxiliary heating power supply carries out thermal field adjustment on the single crystal rod below a melting zone by means of the auxiliary heater, so that the temperature distribution of the single crystal rod can be accurately controlled. The present invention can solve the problem of single crystal rod cracking caused by unreasonable distribution of the thermal field and overlarge thermal stress in the growth process of the large-diameter zone-melted silicon single crystals over 6.5 inches, and simultaneously can improve the thermal field distribution in the growth process of 3-6 inch zone-melted silicon single crystals, solve the problem of broken ridges caused by unreasonable distribution of the thermal field and overlarge thermal stress, improve the productivity of the silicon single crystals to over 85% from 70% in the existing technology and enhance the quality of the silicon single crystals.

BRIEF DESCRIPTION OF THE ATTACHED DRAWINGS

Figure 1:
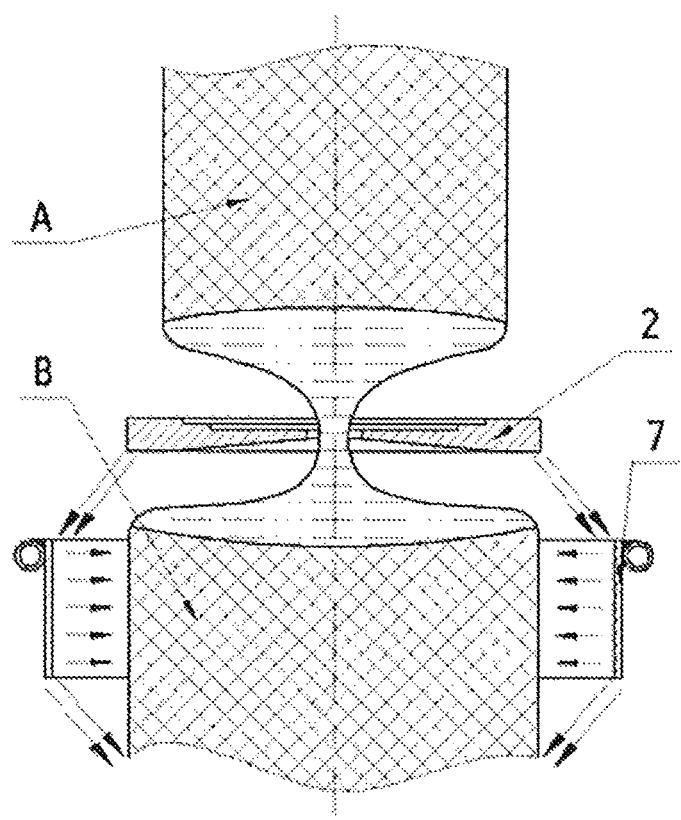
FIG. 1 is the thermal field structure of the traditional technology.

In the attached drawings, the primary heating power supply 1, the primary heating coil 2, the auxiliary heating power supply 3, the auxiliary heater 4, the data analysis module 5, the infrared temperature measuring instrument 6, the heat preservation ring 7, the polycrystalline rod A and the single crystal rod B are marked.

OPTIMAL EMBODIMENTS OF THE PRESENT INVENTION

It needs to be first illustrated that the application of an automatic control technology and a computer technology will be involved in the realization process of the present invention. The applicant holds that the present invention can be realized completely after reading the application document carefully and accurately understanding the realization principle and the invention objective of the present invention. For example, the data analysis module 5 can employ a PLC (Programmable Logic Controller) with an optional model CJ2M produced by OMRON. Those skilled in the art can finish built-in control software by applying their software programming skills on the premise of combining the existing well-known technologies. Therefore, all contents mentioned by the application document of the present invention belong to this category, and the applicant will not enumerate one by one.

The preset invention will be further described in detail as below in conjunction with the attached drawings and the specific embodiments.

Figure 2:
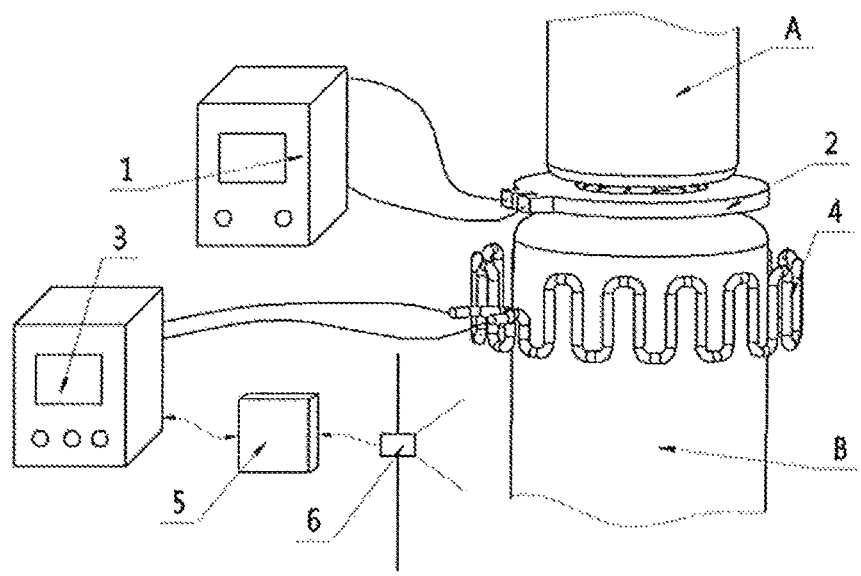
FIG. 2 is the structural schematic diagram of the embodiment of the present invention.

One embodiment of the present invention is described in FIG. 2. the zone melting furnace thermal field with the dual power heating function comprises a primary heating coil 2 provided with a circular hole in the center, a primary heating power supply 1, an auxiliary heating power supply 3, an auxiliary heater 4, an infrared temperature measuring instrument 6 and a data analysis module 5. The main body of the auxiliary heater 4 is made of graphite or silicon, has a wavy appearance bent repeatedly up and down and forms a circular loop by surrounding in the horizontal direction, wherein both end parts of the auxiliary heater are provided with ports and are connected with the auxiliary heating power supply 3 through cables; and the auxiliary heating power supply 3 is also sequentially connected with the data analysis module 5 and the infrared temperature measuring instrument 6 through signal lines.

The primary heating power supply 1 applies a high-frequency alternating current to the primary heating coil 2, and an alternating magnetic field of the same frequency is generated near the primary heating coil 2, the polycrystalline rod A, of which the temperature rises to over 600° C. through a preheating mechanism, will induce the eddy current and generate heat per se, and thus local melting of the polycrystalline rod is realized; molten silicon flows through the center hole of the primary heating coil 2 and is caught by seed crystals below the coil to continuously grow a single crystal rod; the auxiliary heater 4 is disposed outside the single crystal rod B, and is heated by means of the auxiliary heating power supply 3; the infrared temperature measuring instrument 6 is disposed on the furnace wall and the data analysis module 5 is disposed outside the furnace chamber. The diameter of the circular loop surrounded by the auxiliary heater 4 is 150 mm-400 mm, and the height of the wavy shape bent repeatedly up and down is 50 mm-800 mm. The primary heating power supply 1 and the auxiliary heating power supply 3 are independent of each other and can be independently adjusted, and each of which is provided with an anti-interference device. The frequency of the primary heating power supply 1 refers to high frequency, and the auxiliary heating power supply 3 refers to a direct current power supply.

In the present invention, the power of the primary heating power supply 1 can be set in real time on the site by crystal-pulling workers, and also can be adjusted according to a set technological procedure. The infrared temperature measuring instrument 6 disposed on the furnace wall can be configured to detect the temperature of the specific point of the single crystal rod B in real time, and transmit the temperature to the data analysis module 5, and the data analysis module 5 is configured to control the auxiliary heating power through certain control methods, so that the temperature of the specific point of the single crystal rod B can be accurately controlled according to desired technological demands; The zone-melted silicon single crystal growth mainly comprises the stages, such as seeding, shoulder expanding, equal diameter and ending; the data analysis module 5 mainly plays a role in the shoulder expanding, equal diameter and ending stages, and its control target refers to the temperature of the specific point of the single crystal rod B; and the control input refers to the current of the auxiliary heater 4, and different control methods are employed in different growth stages.

In the existing technology, it is often to dispose a heat preservation ring 7 or other heat preservation materials outside the single crystal rod B at the lower end of the coil, however, these devices are opaque generally and may affect the monitoring of the temperature measuring instrument, a CCD (Charge Coupled Device) and other devices to the single crystal rod B and the melting zone. However, by adoption of the auxiliary heater 4 in the present invention, a greater clearance is reserved between the single crystal rod B and the melting zone, so that full-range monitoring of the temperature measuring instrument and the CCD can be ensured.

The zone-melted silicon single crystal growth mainly comprises the stages, such as seeding, shoulder expanding, equal diameter and ending; the built-in control methods in the data analysis module mainly play a role in the shoulder expanding, equal diameter and ending stages, and its control target refers to the temperature of the specific point of the single crystal rod; and the control input refers to the current (power) of the auxiliary heater, and different control methods are employed in different growth stages.

In the shoulder expanding stage, the diameter of the single crystal rod continuously changes, and the change curve $T(d)$ of the temperature of the specific point of the single crystal rod along with the diameter of the single crystal rod is set as a target value, wherein the change curve $T(d)$ of the temperature of the specific point of the single crystal rod along with the diameter of the single crystal rod is obtained in a manner of calibrating the production process of the single crystal rod as a standard reference; and when the diameter of the single crystal rod is D, the target value $T(D)$ of the temperature of the single crystal rod is obtained through looking up the curve, and temperature deviation $\Delta T = T1 - T(D)$, wherein T1 is the temperature, detected by the infrared temperature measuring instrument, of the specific point of the single crystal rod when the diameter of the single crystal rod is D;

the current set value I of the auxiliary heater is controlled in three stages: when the temperature deviation $\Delta T < Tm$, $I = Imax$, namely the auxiliary heater outputs the maximum current; when $\Delta T > Tb$, $I = 0$, namely the auxiliary heater is switched off; when $Tm \leq \Delta T \leq Tb$, $I = I0 - 0.45 \times \Delta T + 0.0038 \times (D/\Delta T)$, wherein Tm is a lower deviation allowed when the target value of the temperature of the single crystal rod is $T(D)$, Tb is an upper deviation allowed when the target value of the temperature of the single crystal rod is $T(D)$, both of which meet $-20° C. \leq Tm \leq 0° C. \leq Tb \leq 20° C.$, and I0 is an initial set value of the current of the auxiliary heater in the shoulder expanding stage and ranges from 0.3 Imax to 0.5 Imax;

in the equal diameter stage, the primary heating power is kept stable basically since the diameter of the single crystal rod is not changed any more, and the current set value I of the auxiliary heater is $I1 + 0.05 \times T$, wherein I1 is an initial set value of the current of the auxiliary heater in the equal diameter stage and ranges from 0.4 Imax to 0.7 Imax, and T is time entering the equal diameter stage;

in the ending stage, a change curve T(d)' of the temperature of the specific point of the single crystal rod along with the diameter of the single crystal rod is set as a target value, wherein the change curve T(d)' of the temperature of the specific point of the single crystal rod along with the diameter of the single crystal rod is obtained in a manner of calibrating the production process of the single crystal rod as a standard reference; and when the diameter of the single crystal rod is D, the target value T(D)' of the temperature of the single crystal rod is obtained through looking up the curve, and temperature deviation ΔT=T1'−T(D)', wherein T1' is the temperature, detected by the infrared temperature measuring instrument, of the specific point of the single crystal rod when the diameter of the single crystal rod is D; and the current set value I of the auxiliary heater is controlled in three stages: when the temperature deviation ΔT'<Tm', I=Imax, namely the auxiliary heater outputs the maximum current; when ΔT'>Tb', I=0, namely the auxiliary heater is switched off; when Tm'≤ΔT'≤Tb', I=I0'−0.65×ΔY'+0.0025×(D/ΔT'), wherein Tm' is a lower deviation allowed when the target value of the temperature of the single crystal rod is T(D)', Tb' is an upper deviation allowed when the target value of the temperature of the single crystal rod is T(D)', both of which meet −20° C.≤Tm'≤0° C.≤Tb'≤20° C., and I0' is an initial set value of the current of the auxiliary heater in the ending stage and ranges from 0.3 Imax to 0.5 Imax.

Figure 3:
FIG. 3 is the implementation effect diagram of the present invention and the existing technology.

In the present invention, the temperature distribution of the single crystal rod B and the melting zone can be accurately controlled according to technological demands and the reasonable thermal field distribution can be obtained through an appropriate power control strategy by adopting the thermal field with the dual power heating function. Compared with the existing technology in which a structure of the single heat source and the heat preservation ring 7 is adopted generally, the thermal field with the dual power heating function is easy to control and also lays a basis for automatic single crystal production of the melting zone. By matching with the reasonable power control strategy, the present invention can solve the problem of single crystal rod cracking caused by unreasonable distribution of the thermal field and overlarge thermal stress in the growth process of the large-diameter zone-melted silicon single crystals over 6.5 inches, and simultaneously can improve the thermal field distribution in the growth process of 3-6 inch zone-melted silicon single crystals, solve the problem of broken ridges caused by unreasonable distribution of the thermal field and overlarge thermal stress, improve the productivity of the silicon single crystals to 85% from 70% in the existing technology and enhance the quality of the silicon single crystals. FIG. 3 refers to statistic data of 10 times of production trials of 6 inch silicon single crystals, which are respectively carried out in the existing technology and the present invention by the same crystal-pulling workers, wherein the silicon single crystal productivity refers to the ratio of the quality to the feeding amount in the production of the single crystal rods meeting the demands.

Of course, the example as above mentioned is just one embodiment of the present invention, and it should notice that a plurality of improvements and polishes made by common technical personnel in the art on the premise of not departing from the technical theory of the present invention should fall into the protection scope of the present invention.

INDUSTRIAL APPLICABILITY

The present invention can solve the problem of single crystal rod cracking caused by unreasonable distribution of the thermal field and overlarge thermal stress in the growth process of the large-diameter zone-melted silicon single crystals over 6.5 inches, and simultaneously can improve the thermal field distribution in the growth process of the 3-6 inch zone-melted silicon single crystals, solve the problem of broken ridges caused by unreasonable distribution of the thermal field and overlarge thermal stress, improve the productivity of the silicon single crystals to over 85% from 70% of the existing technology and enhance the quality of the silicon single crystals.

The invention claimed is:

1. A zone melting furnace heat preservation method on the basis of the zone melting furnace thermal field with the dual power heating function including a primary heating coil provided with a circular hole in a center and connected with a primary heating power supply, and an auxiliary heater which has a wavy appearance bent repeatedly up and down and forms a circular loop by surrounding in a horizontal direction, wherein both end parts of the auxiliary heater are provided with ports and are connected with an auxiliary heating power supply through cables, wherein a diameter of the circular loop is 150 mm-400 mm and a height of the wavy appearance bent repeatedly up and down is 50 mm-800 mm; the auxiliary heating power supply is also sequentially connected with a data analysis module and an infrared temperature measuring instrument through signal lines, the primary heating power supply and the auxiliary heating power supply are independent of each other, and each of the primary heating power supply and the auxiliary heating power supply is provided with a control operation module and a shielding anti-interference device, the method comprising:

applying a direct current power supply to the auxiliary heater by means of the auxiliary heating power supply;

applying thermal irradiation by the auxiliary heater to a single crystal rod growing therein, and thus realizing heat preservation to the single crystal rod;

the infrared temperature measuring instrument is configured to monitor the temperature of a specific point of the single crystal rod in real time and transmit the temperature to the data analysis module, and the data analysis module is configured to control a current of the auxiliary heater by virtue of built-in control methods, so as to adjust a heat preservation effect on the single crystal rod;

wherein the built-in control methods of the data analysis module include a control target that refers to the temperature of the specific point of the single crystal rod, a control input refers to the current of the auxiliary heater, and different control strategies are adopted in different growth stages, comprising:

in a shoulder expanding stage, a diameter of the single crystal rod continuously changes, and a change curve T(d) of the temperature of the specific point of the single crystal rod along with the diameter of the single crystal rod is set as a target value, wherein the change curve T(d) of the temperature of the specific point of the single crystal rod along with the diameter of the single crystal rod is obtained in a manner of calibrating a production process of the single crystal rod as a standard reference; and when the diameter of the single crystal rod is D, the target value T(D) of the temperature of the single crystal rod is obtained through looking up the curve, and temperature deviation ΔT=T1−T(D), wherein T1 is the temperature, detected by the infrared temperature measuring instrument, of the specific point of the single crystal rod when the diameter of the single crystal rod is D;

a current set value I of the auxiliary heater is controlled in three stages:

when the temperature deviation $\Delta T<Tm$, $I=Imax$, namely the auxiliary heater outputs a maximum current;

when $\Delta T>Tb$, $I=0$, namely the auxiliary heater is switched off;

when $Tm \leq \Delta T \leq Tb$, $I=I0-0.45\times\Delta T+0.0038\times(D/\Delta T)$, wherein Tm is a lower deviation allowed when the target value of the temperature of the single crystal rod is T(D), Tb is an upper deviation allowed when the target value of the temperature of the single crystal rod is T(D), both of which meet $-20°$ C.$\leq Tm \leq 0°$ C.$\leq Tb \leq 20°$ C., and I0 is an initial set value of the current of the auxiliary heater in the shoulder expanding stage and ranges from 0.3Imax to 0.5Imax;

in an equal diameter stage, the current set value I of the auxiliary heater is $I1+0.05\times T$, wherein I1 is an initial set value of the current of the auxiliary heater in the equal diameter stage and ranges from 0.4Imax to 0.7Imax, and T is time entering the equal diameter stage;

in an ending stage, a change curve T(d)' of the temperature of the specific point of the single crystal rod along with the diameter of the single crystal rod is set as a target value, wherein the change curve T(d)' of the temperature of the specific point of the single crystal rod along with the diameter of the single crystal rod is obtained in a manner of calibrating the production process of the single crystal rod as a standard reference; and when the diameter of the single crystal rod is D, the target value T(D)' of the temperature of the single crystal rod is obtained through looking up the curve, and temperature deviation $\Delta T=T1'-T(D)'$, wherein the T1' is the temperature, detected by the infrared temperature measuring instrument, of the specific point of the single crystal rod when the diameter of the single crystal rod is D; and a current set value I of the auxiliary heater is controlled in three stages:

when the temperature deviation $\Delta T'<Tm'$, $I=Imax$, namely the auxiliary heater outputs the maximum current; when $\Delta T'>Tb'$, $I=0$, namely the auxiliary heater is switched off;

when $Tm' \leq \Delta T' \leq Tb'$, $I=I0'-0.65\times\Delta T'+0.0025\times(D/\Delta T')$, wherein Tm' is a lower deviation allowed when the target value of the temperature of the single crystal rod is T(D)', Tb' is an upper deviation allowed when the target value of the temperature of the single crystal rod is T(D)', both of which meet $-20°$ C.$\leq Tm \leq 0°$ C.$\leq Tb \leq 20°$ C., and I0' is an initial set value of the current of the auxiliary heater in the ending stage and ranges from 0.3Imax to 0.5Imax.

* * * * *